US012652839B2

(12) United States Patent
Chen et al.

(10) Patent No.: US 12,652,839 B2
(45) Date of Patent: Jun. 9, 2026

(54) SEMICONDUCTOR STRUCTURES

(71) Applicant: Vanguard International Semiconductor Corporation, Hsinchu (TW)

(72) Inventors: Chih-Yen Chen, Hsinchu City (TW); Franky Juanda Lumbantoruan, Medan Denai (ID); Chien-Jen Sun, Hsinchu County (TW); Yi-Wei Lien, Hsinchu City (TW); Tuan-Wei Wang, New Taipei City (TW); Chun-Yang Chen, New Taipei City (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 1112 days.

(21) Appl. No.: 17/697,943

(22) Filed: Mar. 18, 2022

(65) Prior Publication Data

US 2023/0299146 A1    Sep. 21, 2023

(51) Int. Cl.
　H10D 62/815　　(2025.01)
　H10D 30/47　　(2025.01)
　H10D 62/824　　(2025.01)
　H10D 62/85　　(2025.01)

(52) U.S. Cl.
　CPC ..... H10D 62/8164 (2025.01); H10D 30/4738 (2025.01); H10D 62/824 (2025.01); H10D 62/8503 (2025.01)

(58) Field of Classification Search
　CPC .............. H10D 62/824; H10D 62/8503; H01L 21/02507
　See application file for complete search history.

(56) References Cited

U.S. PATENT DOCUMENTS

| | | | |
|---|---|---|---|
| 11,387,356 B2 | 7/2022 | Chen | |
| 2015/0340230 A1* | 11/2015 | Ikuta | C30B 25/183 |
| | | | 438/478 |
| 2015/0357419 A1* | 12/2015 | Lutgen | H10D 62/824 |
| | | | 257/201 |

(Continued)

FOREIGN PATENT DOCUMENTS

| | | |
|---|---|---|
| CN | 103489898 A | 1/2014 |
| CN | 104885198 A | 9/2015 |

(Continued)

*Primary Examiner* — Yara B Green
*Assistant Examiner* — Seth D Lawson
(74) *Attorney, Agent, or Firm* — Winston Hsu

(57) ABSTRACT

A semiconductor structure includes a nucleation layer disposed on a substrate, an epitaxial growth layer disposed above the nucleation layer, and a superlattice structure disposed between the nucleation layer and the epitaxial growth layer. The superlattice structure includes a plurality of alternately stacked superlattice units, and adjacent two superlattice units include a first superlattice unit and a second superlattice unit. The first superlattice unit includes a first superlattice layer and a second superlattice layer stacked thereon, the second superlattice unit includes a third superlattice layer and a fourth superlattice layer stacked thereon, where each of the first, second, third and fourth superlattice layers includes a plurality of pairs of two sublayers with different compositions from each other.

14 Claims, 7 Drawing Sheets

(56)                  References Cited

U.S. PATENT DOCUMENTS

2016/0149000  A1*    5/2016  Sazawa ................ H10D 62/854
                                                          257/18
2019/0362967  A1*   11/2019  Zhao ................. H01L 21/02381
2021/0050422  A1*    2/2021  Liu ...................... H10D 62/824

FOREIGN PATENT DOCUMENTS

KR      10-2015-0095318  A      8/2015
TW              I732593  B      7/2021

* cited by examiner

SEMICONDUCTOR STRUCTURES

BACKGROUND OF THE INVENTION

1. Field of the Invention

The present disclosure relates generally to semiconductor devices, and more particularly to semiconductor structures including a superlattice structure.

2. Description of the Prior Art

In semiconductor technology, group III-V semiconductor compounds may be used to construct various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different energy gaps (i.e., a hetero-junction). The 2-DEG layer is used as the transistor channel instead of a doped region, as is generally the case for metal oxide semiconductor field effect transistors (MOSFETs). Compared with MOSFETs, HEMTs have a number of attractive properties, such as high electron mobility and the ability to transmit signals at high frequencies.

The conventional HEMT may include a channel layer, a barrier layer, a compound semiconductor cap layer, and a gate electrode stacked in sequence. Using the gate electrode to apply a bias voltage to the compound semiconductor cap layer can adjust the concentration of the 2-DEG in the channel layer located under the compound semiconductor cap layer, thereby controlling the on/off states of the HEMT.

A superlattice layer is usually disposed between the aforementioned HEMT's stacked layer and a substrate to avoid the stress caused by lattice mismatch. However, the conventional superlattice layer still cannot satisfy the demand for stress control, resulting in the warpage of the substrate and the HEMT's stacked layer, and the degree of the warpage is changed with the thickness of the superlattice layer. The aforementioned problems of the conventional superlattice layer not only increase the difficulty of the process for fabricating HEMTs, but also reduce the electrical performances of HEMTs.

SUMMARY OF THE INVENTION

In view of this, it is necessary to provide a semiconductor structure including an improved superlattice structure to enhance the stress control effect of the superlattice structure, thereby improving the electrical performances and manufacturing yield of HEMTs.

According to one embodiment of the present disclosure, a semiconductor structure is disclosed and includes a substrate, a nucleation layer, an epitaxial growth layer and a superlattice structure. The nucleation layer is disposed on the substrate, the epitaxial growth layer is disposed above the nucleation layer, and the superlattice structure is disposed between the nucleation layer and the epitaxial growth layer. The superlattice structure includes a plurality of alternately stacked superlattice units, and adjacent two superlattice units includes a first superlattice unit and a second superlattice unit, where the second superlattice unit is stacked on the first superlattice unit. The first superlattice unit includes a first superlattice layer and a second superlattice layer stacked on the first superlattice layer, where the first superlattice layer includes a plurality of pairs of a (1-1)-th sublayer and a (1-2)-th sublayer, and the second superlattice layer includes a plurality of pairs of a (2-1)-th sublayer and a (2-2)-th sublayer. The second superlattice unit includes a third superlattice layer and a fourth superlattice layer stacked on the third superlattice layer, where the third superlattice layer includes a plurality of pairs of a (3-1)-th sublayer and a (3-2)-th sublayer, and the fourth superlattice layer includes a plurality of pairs of a (4-1)-th sublayer and a (4-2)-th sublayer. Where, an aluminum atom concentration of the (2-2)-th sublayer is higher than an aluminum atom concentration of the (1-2)-th sublayer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
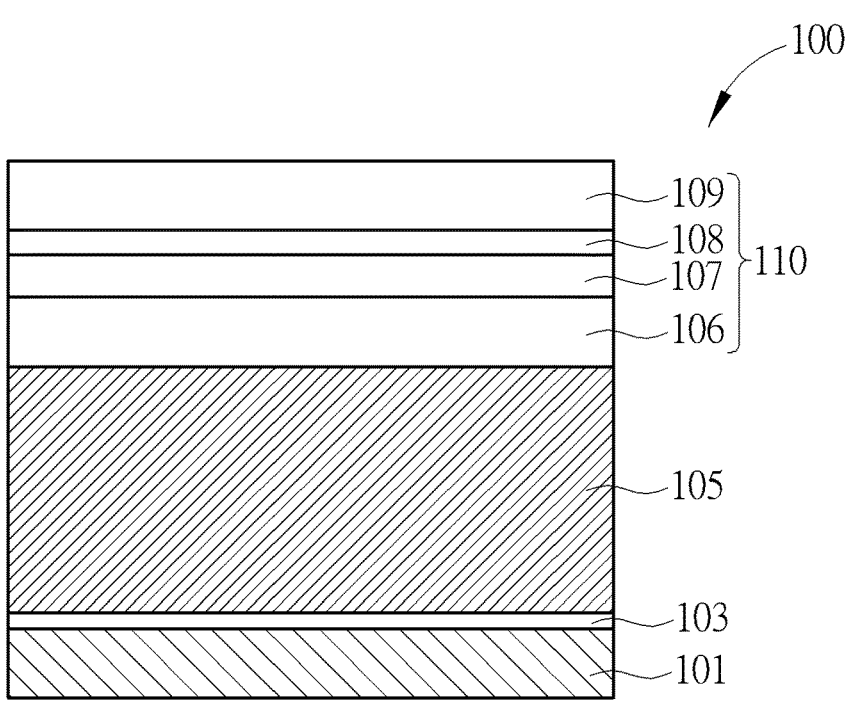
FIG. 1 is a schematic cross-sectional view of a semiconductor structure according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as n-type or p-type.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person having ordinary skill in the art.

The present disclosure is directed to a semiconductor structure including a superlattice structure and a fabrication method thereof. The thickness of the superlattice structure of the semiconductor structure is increased as a plurality of superlattice layers are stacked, but the curvature of the superlattice structure is maintained at a substantially constant level (i.e., as the thickness of the superlattice layers on the substrate increases, the curvature of the overall substrate will not increase or decrease significantly), thereby achieving good stress control. For various thickness requirements of different semiconductor devices, the superlattice structures of the present disclosure can meet the requirement of small bow variation. For example, for high-power radio frequency (RF) gallium nitride high electron mobility transistors (GaN based HEMTs), a superlattice layer with thinner thickness and small bow variation is usually required to improve RF characteristics of the HEMTs. The superlattice structures of the semiconductor structures of the present disclosure are suitable for various thicknesses of the superlattice structures of any HEMTs to achieve better stress control, good device electrical characteristics (e.g., breakdown voltage), and high manufacturing yield, thereby enhancing the application of the semiconductor structures of the present disclosure for semiconductor devices in different fields.

FIG. 1 is a schematic cross-sectional view of a semiconductor structure according to one embodiment of the present disclosure. As shown in FIG. 1, in an embodiment, a semiconductor structure 100 includes a substrate 101, a nucleation layer 103, a superlattice (SL) structure 105, and an epitaxial growth layer 110 disposed from bottom to top in sequence. According to an embodiment, the epitaxial growth layer 110 includes an electrical isolation layer 106, a channel layer 107, a barrier layer 108, and a doped semiconductor cap layer 109 stacked from bottom to top in sequence. The materials of the nucleation layer 103, the superlattice structure 105, and the epitaxial growth layer 110 are group III-V semiconductor materials. In one embodiment, the nucleation layer 103 is, for example, an aluminum nitride (AlN) layer, the electrical isolation layer 106 is, for example, a carbon-doped gallium nitride (c-GaN) layer, the channel layer 107 is, for example, an undoped gallium nitride (u-GaN) layer, the barrier layer 108 is, for example, an aluminum gallium nitride (AlGaN) layer, and the doped semiconductor cap layer 109 is, for example, a p-type gallium nitride (p-GaN) layer, but not limited thereto. The composition and the structure configuration of each layer of the epitaxial growth layer 110 may be determined by the requirements of various semiconductor devices.

Figure 2:
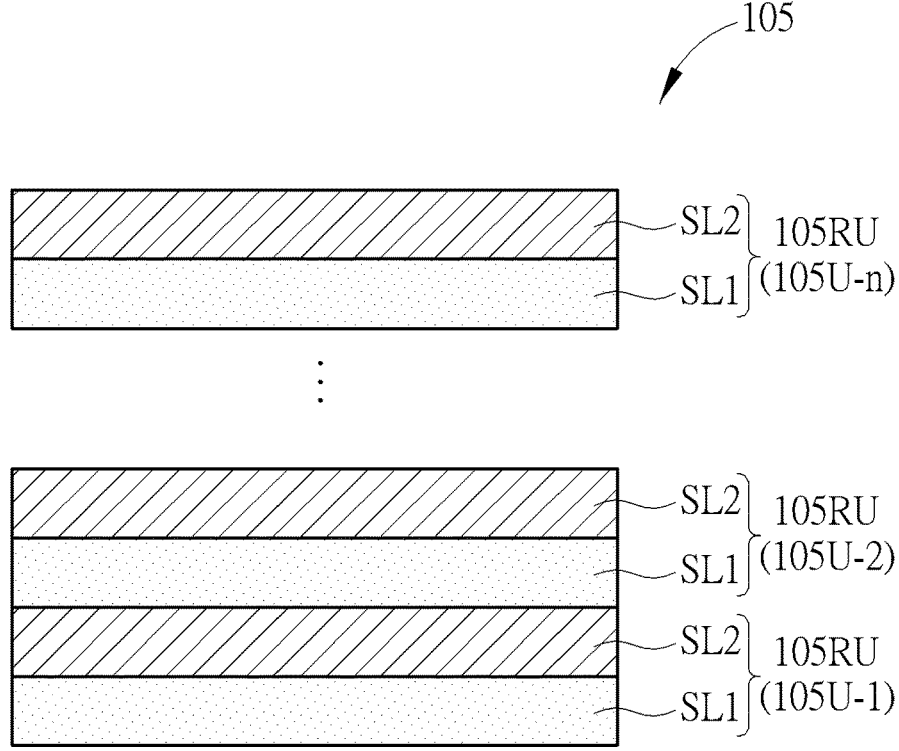
FIG. 2 is a schematic cross-sectional view of a superlattice structure according to one embodiment of the present disclosure.

FIG. 2 is a schematic cross-sectional view of a superlattice structure according to one embodiment of the present disclosure. As shown in FIG. 2, in an embodiment, the superlattice structure 105 includes a plurality of stacked superlattice repeating units 105RU (or superlattice units 105U-1, 105U-2 . . . 105U-n). In order to simplify the diagram, FIG. 2 only shows three superlattice repeating units 105RU. In fact, the superlattice structure 105 may include 5, 10, or other numbers of superlattice repeating units 105RU. In one embodiment, as shown in FIG. 2, each superlattice repeating unit 105RU includes a first superlattice layer SL1 and a second superlattice layer SL2, where the second superlattice layer SL2 is stacked on the first superlattice layer SL1.

Figure 3:
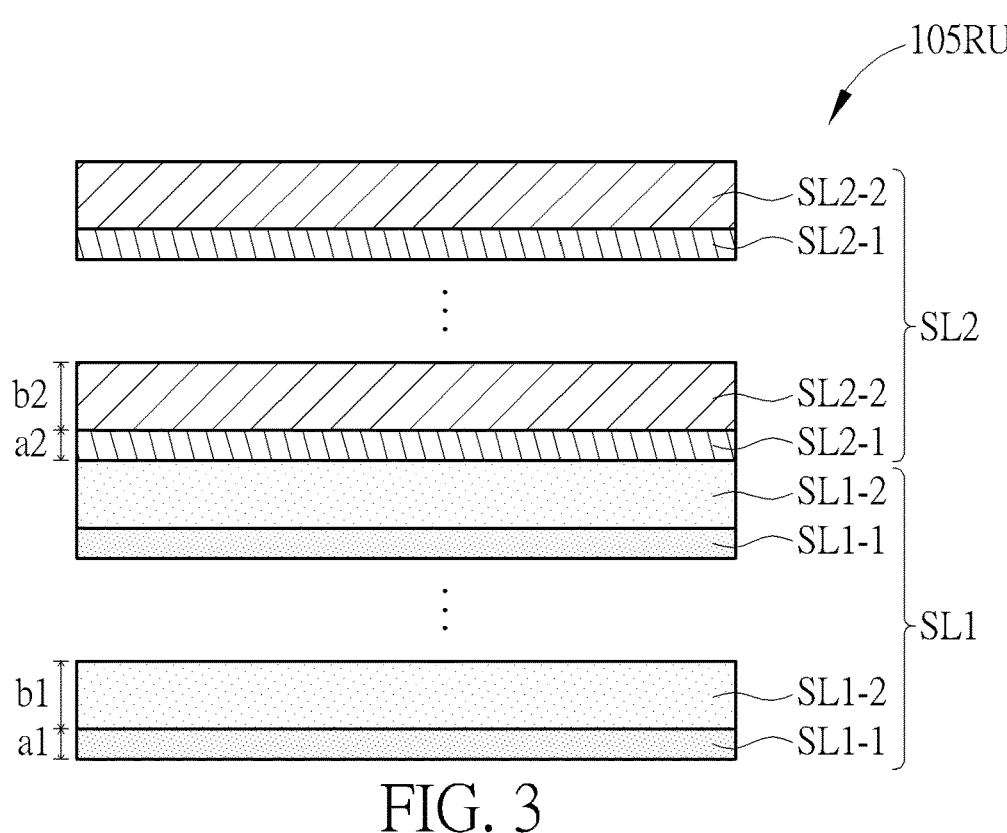
FIG. 3 is a schematic cross-sectional view of a superlattice repeating unit according to one embodiment of the present disclosure.

FIG. 3 is a schematic cross-sectional view of a superlattice repeating unit according to one embodiment of the present disclosure. As shown in FIG. 3, in the embodiment, the first superlattice layer SL1 of the superlattice repeating unit 105RU includes a plurality of stacked pairs of a (1-1)-th sublayer SL1-1 and a (1-2)-th sublayer SL1-2, where the (1-2)-th sublayer SL1-2 is disposed on the (1-1)-th sublayer SL1-1. In addition, the second superlattice layer SL2 of the superlattice repeating unit 105RU also includes a plurality of stacked pairs of a (2-1)-th sublayer SL2-1 and a (2-2)-th sublayer SL2-2, where the (2-2)-th sublayer SL2-2 is disposed on the (2-1)-th sublayer SL2-1. In one embodiment, the first superlattice layer SL1 of each superlattice repeating unit 105RU may include, for example, 12 pairs of the (1-1)-th sublayer SL1-1 and the (1-2)-th sublayer SL1-2. The second superlattice layer SL2 of each superlattice repeating unit 105RU may include, for example, 18 pairs of the (2-1)-th sublayer SL2-1 and the (2-2)-th sublayer SL2-2. Moreover, the superlattice structure 105 may include, for example, five aforementioned superlattice repeating units 105RU. In another embodiment, the first superlattice layer SL1 of each superlattice repeating unit 105RU may include, for example, 6 pairs of the (1-1)-th sublayer SL1-1 and the (1-2) th sublayer SL1-2. The second superlattice layer SL2 of each superlattice repeating unit 105RU may include, for example, 9 pairs of the (2-1)-th sublayer SL2-1 and the (2-2)-th sublayer SL2-2. Moreover, the superlattice structure 105 may include, for example, ten aforementioned superlattice repeating units 105RU. The aforementioned descriptions are for example, and the embodiments of the present disclosure are not limited thereto. The number of superlattice repeating units 105RU, the number of pairs of the sublayers in the first superlattice layer SL1, and the number of pairs of the sublayers in the second superlattice layer SL2 may be changed and determined by the actual requirements of the semiconductor devices.

According to an embodiment of the present disclosure, the (1-1)-th sublayer SL1-1, the (1-2)-th sublayer SL1-2, the (2-1)-th sublayer SL2-1 and the (2-2)-th sublayer SL2-2 of the aforementioned description are multiple aluminum gallium nitride layers with different compositions from each other. For example, the composition of the (1-1)-th sublayer SL1-1 is aluminum gallium nitride ($Al_{x1}Ga_{1-x1}N$) the composition of the (1-2)-th sublayer SL1-2 is aluminum gallium nitride ($Al_{y1}Ga_{1-y1}N$), the composition of the (2-1)-th sublayer SL2-1 is aluminum gallium nitride ($Al_{x2}Ga_{1-x2}N$), and the composition of the (2-2)-th sublayer SL2-2 is aluminum gallium nitride ($Al_{y2}Ga_{1-y2}N$), where the aluminum atom concentration x2 of the (2-1)-th sublayer SL2-1 is greater than the aluminum atom concentration x1 of the (1-1)-th sublayer SL1-1, and the aluminum atom concentration y2 of the (2-2)-th sublayer SL2-2 is greater than the aluminum atom concentration y1 of the (1-2)-th sublayer SL1-2. In addition, as shown in FIG. 3, the thickness of the (1-1)-th sublayer SL1-1 is a1, the thickness of the (1-2)-th sublayer SL1-2 is b1, the thickness of the (2-1)-th sublayer SL2-1 is a2, and the thickness of the (2-2)-th sublayer SL2-2 is b2. In one embodiment, the thickness a1 of the (1-1)-th sublayer SL1-1 is smaller than the thickness a2 of the (2-1)-th sublayer SL2-1, and the thickness b1 of the (1-2)-th sublayer SL1-2 is larger than the thickness b2 of the (2-2)-th sublayer SL2-2. Moreover, in one embodiment, the aluminum atom concentration x1 of the (1-1)-th sublayer SL1-1 is greater than the aluminum atom concentration y1 of the (1-2)-th sublayer SL1-2, and the thickness a1 of the (1-1)-th sublayer SL1-1 is smaller than the thickness b1 of the (1-2)-th sublayer SL1-2. The aluminum atom concentration x2 of the (2-1)-th sublayer SL2-1 is greater than the aluminum atom concentration y2 of the (2-2)-th sublayer SL2-2, and the thickness a2 of the (2-1)-th sublayer SL2-1 is smaller than the thickness b2 of the (2-2)-th sublayer SL2-2. The aforementioned relationships in concentration and thickness between the sublayers are only for examples, and may be adjusted according to the actual requirements of the semiconductor devices.

According to the embodiments of the present disclosure, the average aluminum atom concentration of the second superlattice layer SL2 is greater than the average aluminum atom concentration of the first superlattice layer SL1, i.e., in each superlattice repeating unit 105RU, the average aluminum atom concentration of the superlattice layer stacked on top is higher. Moreover, in the superlattice structure 105, the superlattice layer with a higher average aluminum atom concentration (for example, the second superlattice layer SL2) and the superlattice layer with a lower average aluminum atom concentration (for example, the first superlattice layer SL1) are alternately and periodically stacked on each other. In addition, in one embodiment, the thickness a1 of the (1-1)-th sublayer SL1-1 with a higher aluminum atom concentration and the thickness a2 of the (2-1)-th sublayer SL2-1 with a higher aluminum atom concentration are both less than 10 nanometers (nm), preferably greater than 1 nm and less than 10 nm, for example, 3 nm, 3.5 nm, 8 nm or other thicknesses less than 10 nm. In addition, the thickness b1 of the (1-2)-th sublayer SL1-2 with a lower aluminum atom concentration and the thickness b2 of the (2-2)-th sublayer SL2-2 with a lower aluminum atom concentration are both greater than or equal to 10 nm and less than 50 nm, for example, 10 nm, 15 nm, 20 nm, 36 nm or other thicknesses greater than 10 nm. Cracks or stress-induced defects can be prevented from being generated in each of the (1-1)-th sublayers SL1-1 and each of the (1-2)-th sublayers SL1-2 through adjusting the thicknesses thereof.

Figure 4:
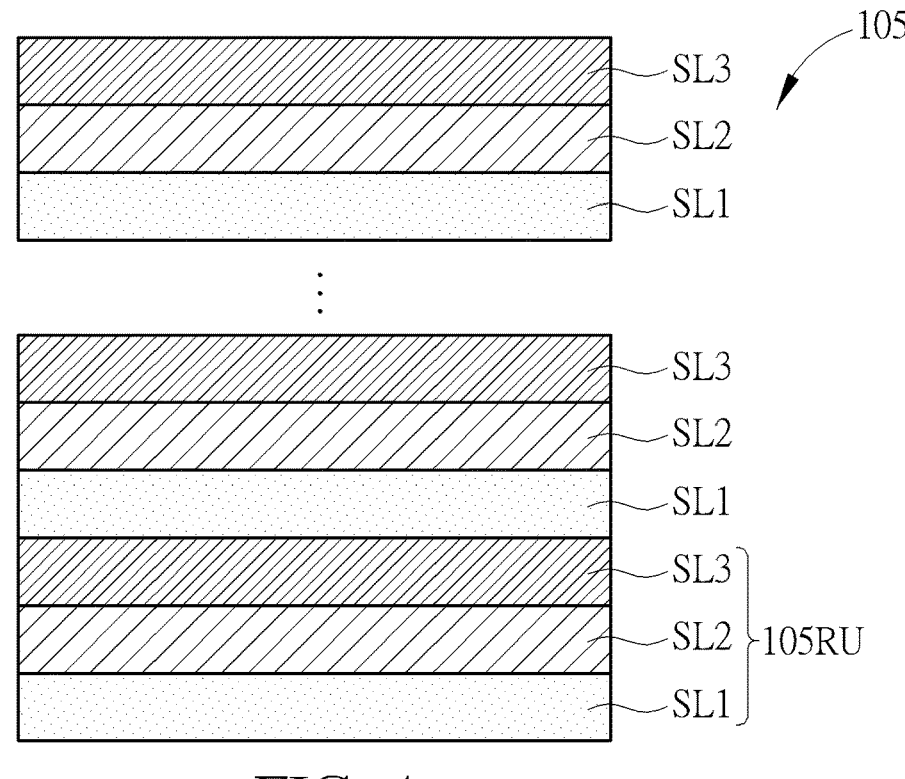
FIG. 4 is a schematic cross-sectional view of a superlattice structure according to another embodiment of the present disclosure.

FIG. 4 is a schematic cross-sectional view of a superlattice structure according to another embodiment of the present disclosure. As shown in FIG. 4, in the embodiment, each superlattice repeating unit 105RU of the superlattice structure 105 includes not only the first superlattice layer SL1 and the second superlattice layer SL2, but also a third superlattice layer SL3 stacked on the second superlattice layer SL2. Although FIG. 4 shows three superlattice repeating units 105RU, the superlattice structure 105 may include two, five, or other numbers of superlattice repeating units 105RU according to different embodiments. The number of superlattice repeating units 105RU is decided depending on the requirements of the semiconductor devices applying the superlattice structure.

Figure 5:
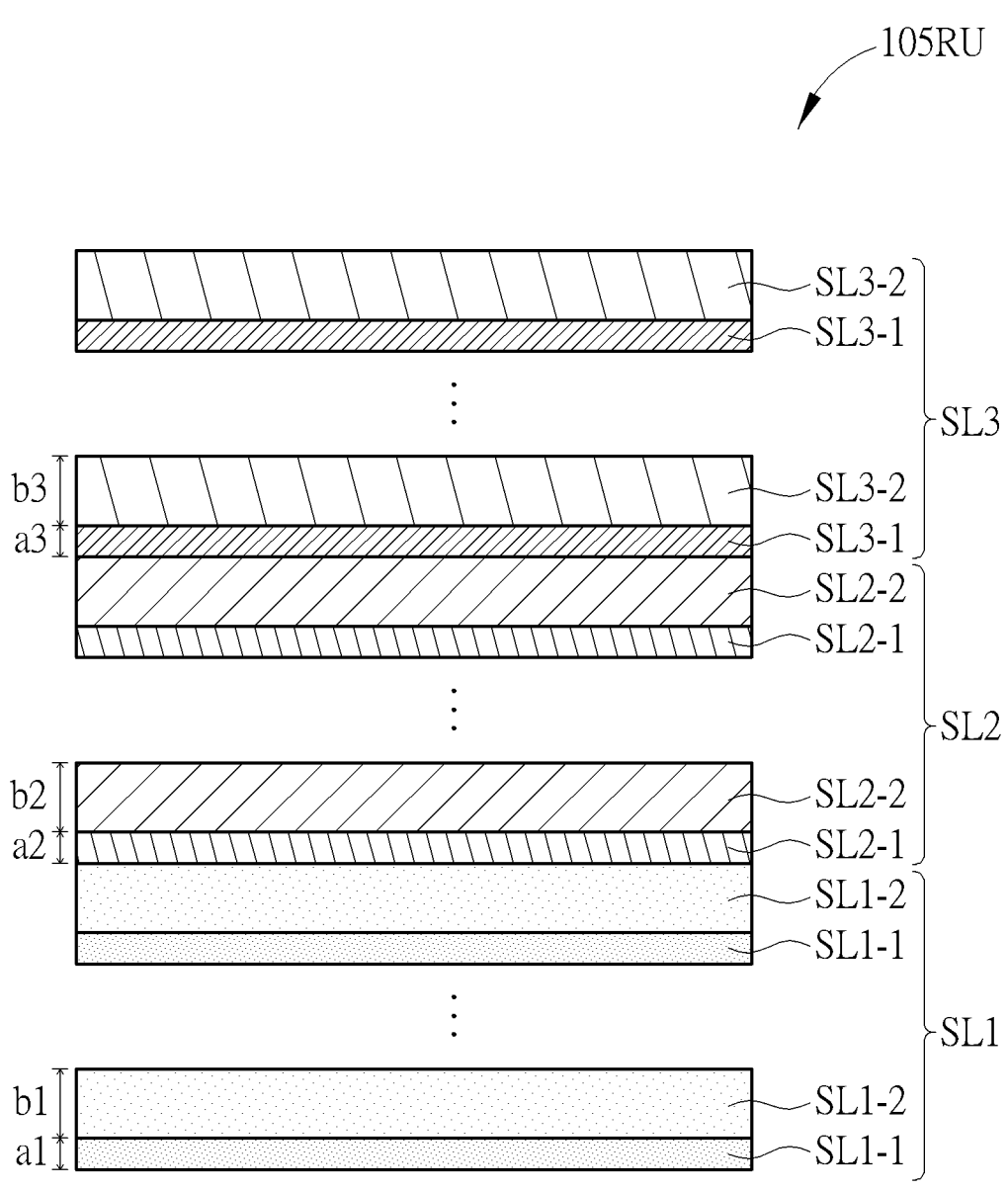
FIG. 5 is a schematic cross-sectional view of a superlattice repeating unit according to another embodiment of the present disclosure.

FIG. 5 is a schematic cross-sectional view of a superlattice repeating unit according to another embodiment of the present disclosure. As shown in FIG. 5, in the embodiment, each superlattice repeating unit 105RU includes a first superlattice layer SL1, a second superlattice layer SL2, and a third superlattice layer SL3 stacked from bottom to top in sequence. The compositions, the thicknesses, and the configurations of the respective sublayers of the first superlattice layer SL1 and the second superlattice layer SL2 may refer to the aforementioned description of FIG. 3, and will not be repeated here. In the embodiment, the third superlattice layer SL3 includes a plurality of stacked pairs of a (3-1)-th sublayer SL3-1 and a (3-2)-th sublayer SL3-2. The compositions of these sublayers of the third superlattice layer SL3 are different from the compositions of the respective sublayers of the first superlattice layer SL1 and the second superlattice layer SL2. For example, the composition of the (3-1)-th sublayer SL3-1 is aluminum gallium nitride ($Al_{x3}Ga_{1-x3}N$), and the composition of the (3-2)-th sublayer SL3-2 is aluminum gallium nitride ($Al_{y3}Ga_{1-y3}N$). The thickness of the (3-1)-th sublayer SL3-1 is a3, and the thickness of the (3-2)-th sublayer SL3-2 is b3. In one embodiment, the aluminum atom concentration x3 of the (3-1)-th sublayer SL3-1 is greater than the aluminum atom concentration x2 of the (2-1)-th sublayer SL2-1, and the aluminum atom concentration y3 of the (3-2)-th sublayer SL3-2 is greater than the aluminum atom concentration y2 of the (2-2)-th sublayer SL2-2. In the embodiment, the average aluminum atom concentration of the third superlattice layer SL3 is greater than the average aluminum atom concentration of the second superlattice layer SL2. In addition, the thickness a3 of the (3-1)-th sublayer SL3-1 is greater than the thickness a2 of the (2-1)-th sublayer SL2-1, and the thickness b3 of the (3-2)-th sublayer SL3-2 is smaller than the thickness b2 of the (2-2)-th sublayer SL2-2. Moreover, the aluminum atom concentration x3 of the (3-1)-th sublayer SL3-1 is greater than the aluminum atom concentration y3 of the (3-2)-th sublayer SL3-2, and the thickness a3 of the (3-1)-th sublayer SL3-1 is smaller than the thickness b3 of the (3-2)-th sublayer SL3-2. According to the embodiment of the present disclosure, among the paired sublayers of each superlattice layer, the sublayer with a higher aluminum atom concentration has a thinner thickness, and the sublayer with a lower aluminum atom concentration has a thicker thickness.

Figure 6:
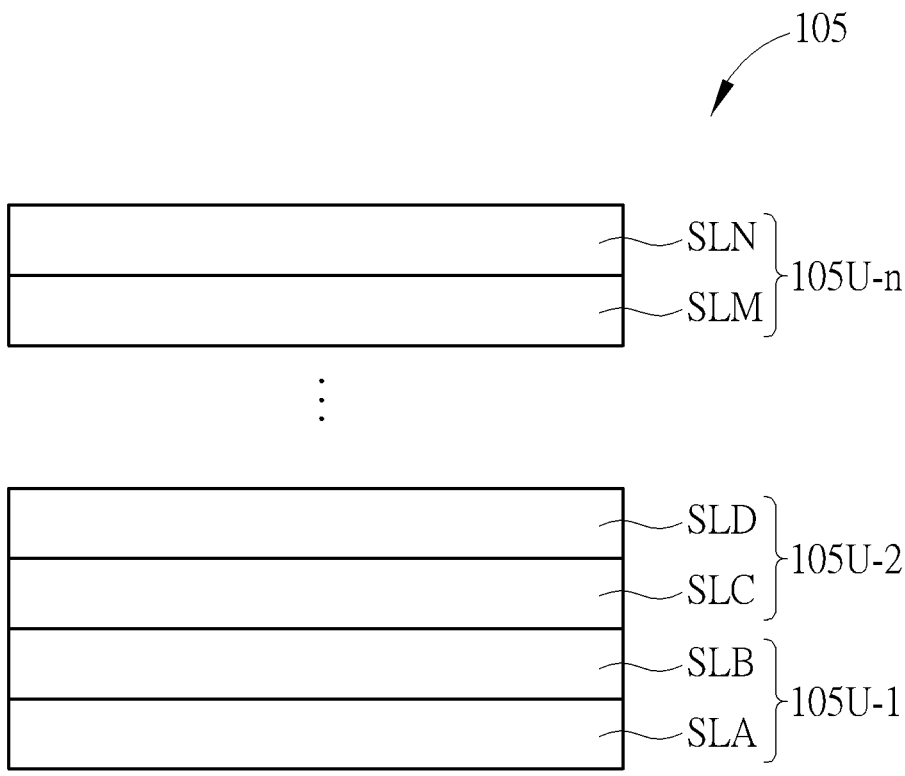
FIG. 6 is a schematic cross-sectional view of a superlattice structure according to further another embodiment of the present disclosure.

FIG. 6 is a schematic cross-sectional view of a superlattice structure according to further another embodiment of the present disclosure. As shown in FIG. 6, in the embodiment, the superlattice structure 105 includes a plurality of stacked superlattice units, such as a first superlattice unit 105U-1, a second superlattice unit 105U-2, and a n-th superlattice unit 105U-n, in fact, the superlattice structure 105 may include 2, 5, 8, 10 or other numbers of superlattice units, where n is preferably greater than or equal to 3, and the compositions of these superlattice units 105U-1, 105U-2, and 105U-n may be the same or different from each other. The first superlattice unit 105U-1 may include a first superlattice layer SLA and a second superlattice layer SLB, where the second superlattice layer SLB is stacked on the first superlattice layer SLA. Referring to the aforementioned description of FIG. 3, similarly, the first superlattice layer SLA may include a plurality of stacked pairs of sublayers, and the second superlattice layer SLB also includes a plurality of stacked pairs of sublayers. The compositions, the thicknesses, and the configuration relationships of these paired sublayers of the first superlattice layer SLA and the second superlattice layer SLB may refer to the aforementioned description of those sublayers SL1-1 and SL1-2 of the first superlattice layer SL1 and those sublayers SL2-1 and SL2-2 of the second superlattice layer SL2 in FIG. 3, and will not be repeated here.

The second superlattice unit 105U-2 may include a third superlattice layer SLC and a fourth superlattice layer SLD, where the fourth superlattice layer SLD is stacked on the third superlattice layer SLC. Similarly, the third superlattice layer SLC may include a plurality of stacked pairs of sublayers, and the fourth superlattice layer SLD also includes a plurality of stacked pairs of sublayers. The compositions, the thicknesses, and the configuration relationships of these paired sublayers of the third superlattice layer SLC and the fourth superlattice layer SLD may also refer to the aforementioned descriptions of those sublayers SL1-1 and SL1-2 of the first superlattice layer SL1 and those sublayers SL2-1 and SL2-2 of the second superlattice layer SL2 in FIG. 3. Similarly, the n-th superlattice unit 105U-n may include an M-th superlattice layer SLM and an N-th superlattice layer SLN, where the N-th superlattice layer SLN is stacked on the M-th superlattice layer SLM. Similarly, the N-th superlattice layer SLN may include a plurality of stacked pairs of sublayers, and the M-th superlattice layer SLM also includes a plurality of stacked pairs of sublayers. The compositions, the thicknesses, and the configuration relationships of these paired sublayers of the M-th superlattice layer SLM and the N-th superlattice layer SLN may also refer to the aforementioned descriptions of those sublayers SL1-1 and SL1-2 of the first superlattice layer SL1 and those sublayers SL2-1 and SL2-2 of the second superlattice layer SL2 in FIG. 3, and will not be repeated here.

According to an embodiment of the present disclosure, the average aluminum atom concentration of the second superlattice layer SLB in the superlattice structure 105 of FIG. 6 is higher than the average aluminum atom concentration of the first superlattice layer SLA, the average aluminum atom concentration of the fourth superlattice layer SLD is higher than the average aluminum atom concentration of the third superlattice layer SLC, and the average aluminum atom concentration of the N-th superlattice layer SLN is higher than the average aluminum atom concentration of the M-th superlattice layer SLM. In addition, the average aluminum atom concentrations of the first superlattice layer SLA, the third superlattice layer SLC and the M-th superlattice layer SLM may be equal.

According to an embodiment of the present disclosure, the first superlattice layer SLA, the third superlattice layer SLC, and the M-th superlattice layer SLM (referred to as a first group) of FIG. 6 may not be completely the same in thickness or atomic composition. For example, the thickness difference between the multiple superlattice layers of the first group may be smaller than about 5%, and the atomic composition of the multiple superlattice layers of the first group may be the same, but the atomic composition ratio thereof may be different from each other. In addition, the thickness or atomic composition of the second superlattice layer SLB, the fourth superlattice layer SLD, and the N-th superlattice layer SLN (referred to as a second group) may not be completely the same. For example, the thickness difference between the multiple superlattice layers of the second group may be smaller than about 5%, and the atomic composition of the multiple superlattice layers of the second group may be the same, but the atomic composition ratio thereof may be different from each other. Furthermore, the similarity in thickness or atomic composition between the superlattice layers of the first group and the superlattice layers of the second group is lower than the similarity in thickness or atomic composition between the respective superlattice layers in the first group, or lower than the similarity in thickness or atomic composition between the respective superlattice layers in the second group, but the present disclosure is not limited thereto.

Moreover, in another embodiment, the first superlattice unit 105U-1 may further include a fifth superlattice layer (not shown in FIG. 6) stacked on the second superlattice layer SLB. The fifth superlattice layer may include a plurality of stacked pairs of sublayers. The relationships in the compositions, the thicknesses, and the configurations between the paired sublayers of the fifth superlattice layer and the paired sublayers of the second superlattice layer SLB may refer to the aforementioned description of the paired sublayers of the third superlattice layer SL3 and the paired sublayers of the second superlattice layer SL2 in FIG. 5. Similarly, another superlattice layer may be stacked on the fourth superlattice layer SLD of the second superlattice unit 105U-2 and/or on the N-th superlattice layer SLN of the n-th superlattice unit 105U-n. The embodiments of the present disclosure are not limited to the aforementioned configurations of the superlattice structures in FIG. 2 to FIG. 6, and a portion of the superlattice structures of the embodiments of FIG. 2 to FIG. 6 may be mixed, replaced or combined to provide other embodiments according to the actual requirements of application for semiconductor devices.

In addition, according to an embodiment of the present disclosure, a fabrication method of the semiconductor structure 100 of FIG. 1 includes the following steps: first, the substrate 101 is provided, and the nucleation layer 103 is formed on the substrate 101. The material of the nucleation layer 103 includes silicon, gallium nitride, ceramics, silicon carbide, aluminum nitride, aluminum oxide, or a combination thereof, which is used as the nucleation layer for the subsequently formed superlattice structure 105, but the present disclosure is not limited thereto. Then, anatomic layer deposition (ALD) process is performed to form the superlattice structure 105 on the nucleation layer 103, where the ALD process includes a plurality of ALD loops. Referring to FIG. 3, each ALD loop includes depositing a plurality of pairs of the (1-1)-th sublayer SL1-1 and the (1-2)-th sublayer SL1-2 to form the first superlattice layer SL1, and depositing a plurality of pairs of the (2-1)-th sublayer SL2-1 and the (2-2)-th sublayer SL2-2 to form the second superlattice layer SL2 on the first superlattice layer SL1. The aforementioned ALD loop is repeated several times to complete the fabrication of the superlattice structure 105. The initially formed (1-1)-th sublayer SL1-1 and the initially formed (2-1)-th sublayer SL2-1 in the aforementioned ALD process are, for example, aluminum nitride (AlN) layers, and the initially formed (1-2)-th sublayer SL1-2 and the initially formed (2-2)-th sublayer SL2-2 are, for example, an aluminum gallium nitride (AlGaN) layer. During the ALD process, the gallium atoms in the AlGaN layer will diffuse to the adjacent AlN layer, such that the last formed (1-1)-th sublayer SL1-1 and the last formed (2-1) sublayer SL2-1 will become AlGaN layers containing a small amount of gallium atoms, where the aluminum atom concentration of the (1-1)-th sublayer SL1-1 is higher than the aluminum atom concentration of the (1-2)-th sublayer SL1-2, the aluminum atom concentration of the (2-1)-th sublayer SL2-1 is higher than the aluminum atom concentration of the (2-2)-th sublayer SL2-2, the aluminum atom concentration of the (2-2)-th sublayer SL2-2 is higher than the aluminum atom concentration of the (1-2)-th sublayer SL1-2, and the aluminum atom concentration of the (2-1)-th sublayer SL2-1 is higher than the aluminum atom concentration of the (1-1)-th sublayer SL1-1. Next, referring to FIG. 1, the epitaxial growth layer 110 is formed on the superlattice structure 105 by an epitaxial growth process. The details of the compositions and the structure configurations of the respective layers of the superlattice structure 105 and the epitaxial growth layer 110 may refer to the aforementioned descriptions of FIG. 1 to FIG. 6, and will not be repeated here.

Figure 7:
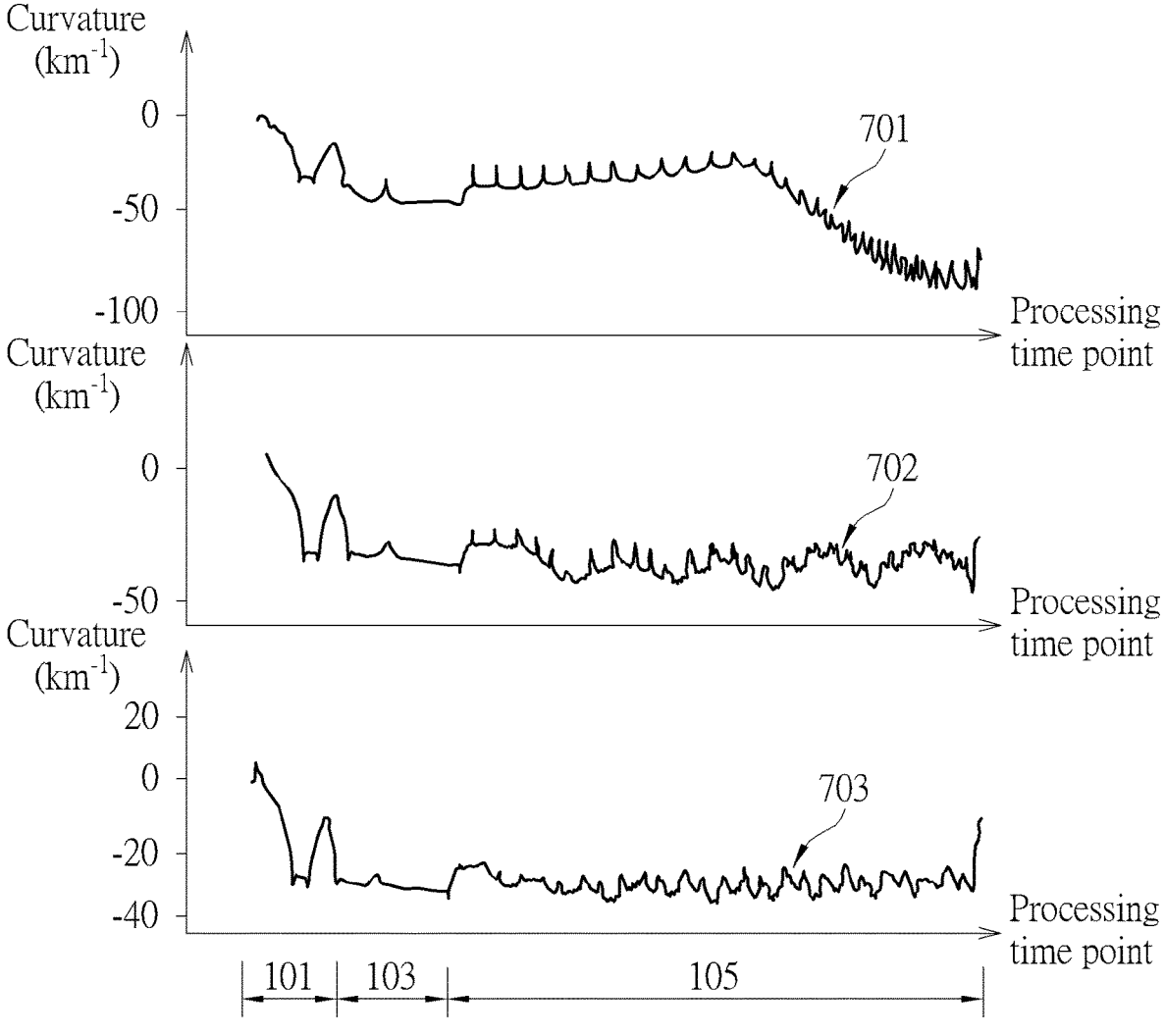
FIG. 7 shows profiles of the curvatures of semiconductor structures changing with different processing time points according to a comparative example and two embodiments of the present disclosure.

FIG. 7 shows profiles of the variation in the curvatures of semiconductor structures with respect to different processing time points according to a comparative example and two embodiments of the present disclosure, where the profiles 701, 702, and 703 represent the curvatures of the semiconductor structures of the comparative example, the embodiment A, and the embodiment B, respectively. In addition, FIG. 7 shows the curvatures of the semiconductor structures at different processing time points (for example, corresponding to the time point when the substrate 101 is provided, the time point when the nucleation layer 103 is formed, and the time point when the superlattice structure 105 is formed). The difference between the comparative example, the embodiment A and the embodiment B in FIG. 7 is that the arrangements of the first superlattice layer and the second superlattice layer in the superlattice structures 105 are different. The superlattice structure of the comparative example consists of a first superlattice layer and a second superlattice layer, where the second superlattice layer is stacked on the first superlattice layer without superlattice repeating units. The first superlattice layer of the comparative example is formed by stacking 60 pairs of the (1-1)-th sublayer and the (1-2)-th sublayer. The second superlattice layer of the comparative example is formed by stacking 90 pairs of the (2-1)-th sublayer and the (2-2)-th sublayer.

The superlattice structure of the embodiment A is formed by stacking 5 superlattice repeating units, and each superlattice repeating unit consists of a first superlattice layer and a second superlattice layer, where the second superlattice layer is stacked on the first superlattice layer. The first superlattice layer of the embodiment A is formed by stacking 12 pairs of the (1-1)-th sublayer and the (1-2)-th sublayer, and the second superlattice layer of the embodiment A is formed by stacking 18 pairs of the (2-1)-th sublayer and the (2-2)-th sublayer.

The superlattice structure of the embodiment B is formed by stacking 10 superlattice repeating units, and each superlattice repeating unit consists of a first superlattice layer and a second superlattice layer, where the second superlattice layer is stacked on the first superlattice layer. The first superlattice layer of the embodiment B is formed by stacking 6 pairs of the (1-1)-th sublayer and the (1-2)-th sublayer, and the second superlattice layer of the embodiment B is formed by stacking 9 pairs of the (2-1)-th sublayer and the (2-2)-th sublayer. The total thicknesses of the superlattice structures of the comparative example, the embodiment A and the embodiment B are substantially the same, and the compositions of the (1-1)-th sublayer, the (1-2)-th sublayer, the (2-1)-th sublayer and the (2-2)-th sublayer of the comparative example, the embodiment A and the embodiment B are the same.

As shown in the profile 701 of FIG. 7, the curvature of the semiconductor structure of the comparative example changes sharply as the deposition thickness of the superlattice structure increases. After the middle deposition section for forming the superlattice structure, the curvature of the profile 701 is increased from about $-40$ km$^{-1}$ to about $-100$ km$^{-1}$. In addition, as shown in the profile 702 of FIG. 7, the curvature of the semiconductor structure of the embodiment A increases as the thickness of the deposited superlattice structure increases, but the curvature of the semiconductor structure substantially does not change too much, and the curvature of the profile 702 is maintained at the level of about $-40$ km$^{-1}$. As shown in the profile 703 of FIG. 7, the curvature of the semiconductor structure of the embodiment B also substantially does not change too much as the thickness of the deposited superlattice structure increases, and the curvature of the profile 703 is maintained at the level of about $-35$ km$^{-1}$. As shown in the curvature profiles 701, 702, and 703 of FIG. 7, the curvatures of the semiconductor structures according to the embodiments of the present disclosure (corresponding to the profiles 702 and 703) are substantially maintained at a constant level without significant change as the deposition thickness of the superlattice structure increases.

Figure 8:
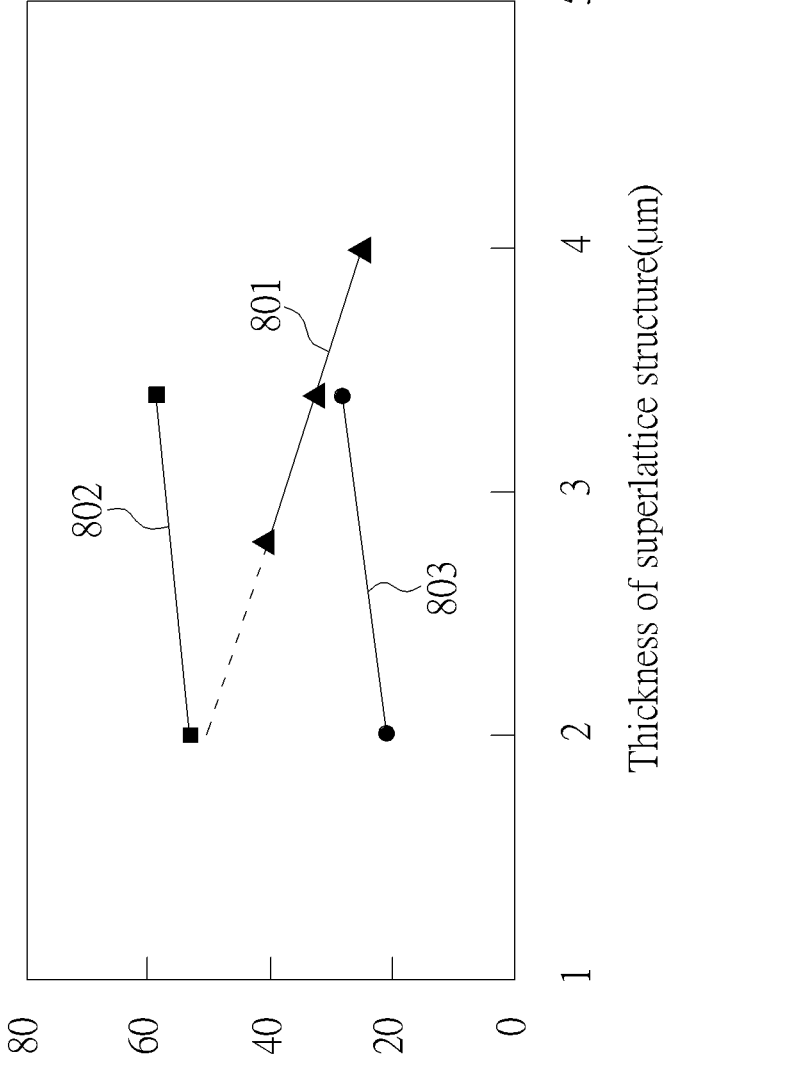
FIG. 8 shows profiles of the bow variations of semiconductor structures changing with different thicknesses of superlattice structures according to a comparative example and two embodiments of the present disclosure.

FIG. 8 shows profiles of variation in the bow (or warpage) variations of semiconductor structures with respect to different thicknesses of superlattice structures according to a comparative example and two embodiments of the present disclosure, where the profiles 801, 802, and 803 are the bow variations of semiconductor structures of the comparative example, the embodiment A and the embodiment B, respectively, with respect to different thicknesses of superlattice structures. The bow variation (ΔBow) is the difference between the bow of an original substrate (before a superlattice structure is formed thereon) and the bow of the substrate having superlattice structures thereon (the bow of the substrate is measured when the substrate is taken from the ALD chamber and cooled down to room temperature). Therefore, the amount of the bow variation (ΔBow) is affected by both the lattice constant matching and the thermal expansion coefficient of the superlattice structure with the substrate. The superlattice structures of the comparative example, the embodiment A and the embodiment B of FIG. 8 may refer to the aforementioned description of FIG. 7.

As shown in the profile 801 of FIG. 8, the bow variation (ΔBow) of the comparative example decreases sharply as the thickness of the superlattice structure increases. Therefore, the slope of the profile 801 is large. When the thickness of the superlattice structure of the comparative example is thinner, for example, 2 micrometers (μm), the bow variation (ΔBow) of the semiconductor structure is largest. As shown in the profile 802 of FIG. 8, the bow variation (ΔBow) of the embodiment A does not change too much as the thickness of the superlattice structure increases, and is substantially maintained at a constant level. Therefore, the slope of the profile 802 is small. In addition, as shown in the profile 803 of FIG. 8, the bow variation (ΔBow) of the embodiment B also does not change too much as the thickness of the superlattice structure increases, and is substantially maintained at a constant level. Therefore, the slope of the profile 803 is also small. Moreover, the bow variation (ΔBow) of the profile 803 is smaller than that of the profile 802.

As shown in the profiles 801, 802, and 803 of the bow variations (ΔBow) of the comparative example, the embodiment A, and the embodiment B of FIG. 8, the bow variations of the superlattice structures according to the embodiments of the present disclosure are substantially maintained at a constant level as the thickness of the superlattice structure increases. Moreover, while the number of superlattice repeating units of the superlattice structure of the embodiment B is twice as much as the number of superlattice repeating units of the embodiment A, the bow variation (ΔBow) is significantly reduced from a range of about 50 μm to 60 μm to a range of about 20 μm to 30 μm. Therefore, according to the embodiments of the present disclosure, while the compositions of the paired sublayers of the superlattice structure are not changed, and the arrangement order of the multiple superlattice layers in the superlattice structure is changed, good stress control is achieved. In addition, as shown in the profiles 802 and 803 of the bow variations (ΔBow) of the embodiment A and the embodiment B of FIG. 8, while the number of superlattice repeating units of the superlattice structure increases, i.e., the number of ALD loops increases, the bow variation (ΔBow) is lower, which means that the greater the number of ALD loops, the better the stress control for the superlattice structure.

Figure 9:
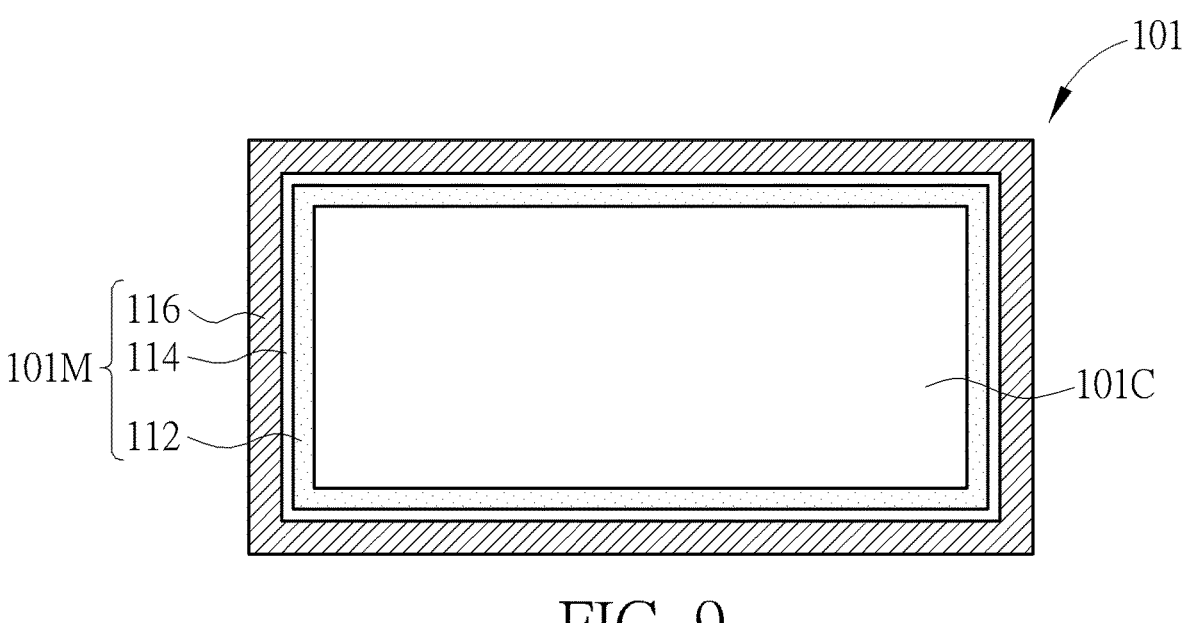
FIG. 9 is a schematic cross-sectional view of a substrate according to one embodiment of the present disclosure.

FIG. 9 is a schematic cross-sectional view of a substrate according to one embodiment of the present disclosure. According to the embodiments of the present disclosure, the substrate 101 of FIG. 1 may be a silicon substrate, a silicon-on-insulator (SOI) substrate, or a composite structure substrate as shown in FIG. 9. The composite structure substrate includes a core substrate 101C, and a composite material layer 101M wrapping around the top, the bottom, and the side surfaces of the core substrate 101C. The material of the core substrate 101C may be a material that matches the thermal expansion coefficients of the superlattice structure 105 and the epitaxial growth layer 110 which are subsequently formed on the substrate 101, for example, ceramics, silicon carbide, aluminum nitride, or sapphire. Moreover, the core substrate 101C may be made of materials with greater hardness to provide the substrate 101 with sufficient mechanical strength. According to an embodiment of the present disclosure, the composite material layer 101M may include insulating material layers 112 and 116 and a semiconductor material layer 114, where the semiconductor material layer 114 is sandwiched between the insulating material layer 112 and the insulating material layer 116. The insulating material layer 112 may be an oxide, such as silicon oxide. The insulating material layer 116 may be nitride, oxide, oxynitride, or a combination thereof. For example, the insulating material layer 116 may be consisted of silicon nitride, silicon oxide, and silicon nitride. The semiconductor material layer 114 may be a silicon layer or a polysilicon layer. In addition, according to different requirements of semiconductor devices, after the semiconductor structure of FIG. 1 is formed, a thinning process may be performed on the substrate 101, such as grinding the back side of the substrate 101, thereby exposing the core substrate 101C of the composite structure substrate.

Figure 10:
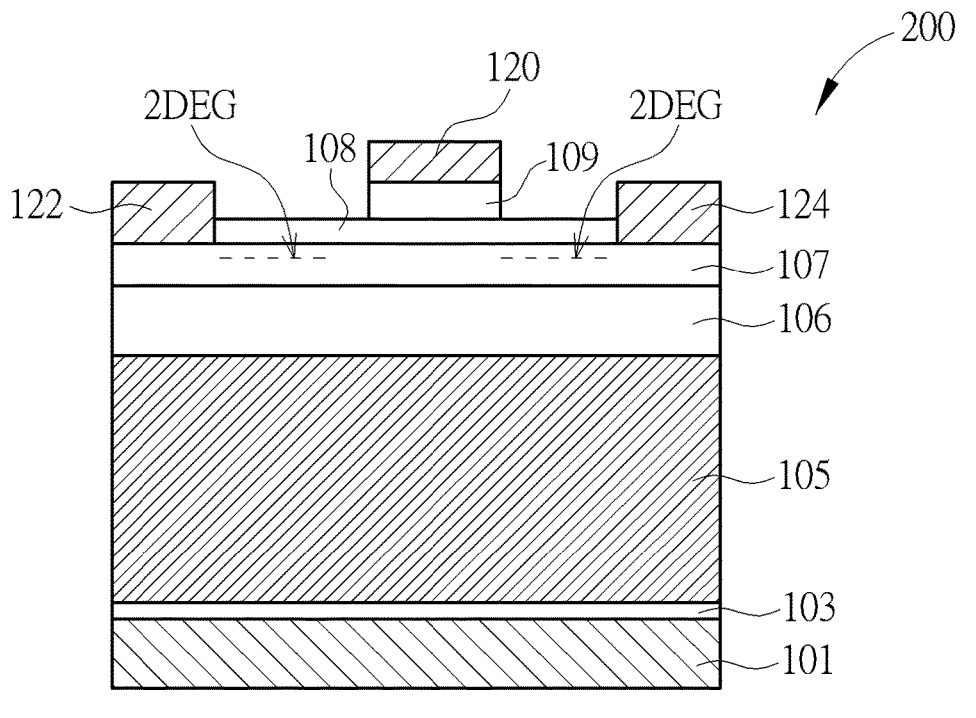
FIG. 10 is a schematic cross-sectional view of a high electron mobility transistor (HEMT) according to one embodiment of the present disclosure.

FIG. 10 is a schematic cross-sectional view of a high electron mobility transistor (HEMT) according to an embodiment of the present disclosure. As shown in FIG. 10, the semiconductor structure 100 of FIG. 1 may be applied to a HEMT 200. After the semiconductor structure 100 is completed, the doped semiconductor cap layer 109 of the epitaxial growth layer 110 is patterned. Then, a gate electrode 120 is formed on the patterned doped semiconductor cap layer 109, and a source electrode 122 and a drain electrode 124 are formed on two opposite sides of the gate electrode 120 respectively. The source electrode 122 and the drain electrode 124 may pass through the barrier layer 108 or further extend downward to a position of the channel layer 107 in depth. Since there is a discontinuous energy gap between the channel layer 107 and the barrier layer 108 of the epitaxial growth layer 110, by stacking the channel layer 107 and the barrier layer 108 on each other, electrons will be gathered on the heterojunction between the channel layer 107 and the barrier layer 108 due to the piezoelectric effect, thereby generating a thin layer with high electron mobility, i.e., a two-dimensional electron gas region 2DEG. For normally off devices, when no voltage is applied to the gate electrode 120, the region covered by the doped semiconductor cap layer 109 will not form two-dimensional electron gas (as shown in FIG. 10), which is regarded as a 2DEG cut-off region, and there is no conduction between the source electrode 122 and the drain electrode 124. When a positive voltage is applied to the gate electrode 120, the region covered by the doped semiconductor cap layer 109 will form a two-dimensional electron gas, such that a continuous two-dimensional electron gas region is generated between the source electrode 122 and the drain electrode 124, and a conduction is produced between the source electrode 122 and the drain electrode 124.

According to an embodiment of the disclosure, when the semiconductor structure is applied to a high power RF GaN based HEMT, a thinner superlattice structure can be provided to meet the requirements of high power RF GaN based HEMI and good stress control is also achieved, thereby improving the radio frequency characteristics of the HEMT. In addition, the bow (or warpage) of the substrate is prevented while the thicknesses of the superlattice structures of the embodiments of the present disclosure are changed. Therefore, the superlattice structures of the present disclosure are suitable to superlattice structures with various thicknesses, and reduce the possibility of cracks caused by stress, thereby enhancing the reliability and product applications of the semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a nucleation layer, disposed on a substrate;
an epitaxial growth layer, disposed above the nucleation layer; and
a superlattice structure, disposed between the nucleation layer and the epitaxial growth layer, wherein the superlattice structure comprises a plurality of alternately stacked superlattice units, and adjacent two of the superlattice units comprises:
a first superlattice unit, comprising a first superlattice layer and a second superlattice layer stacked on the first superlattice layer, wherein the first superlattice layer comprises a plurality of pairs of a (1-1)-th sublayer and a (1-2)-th sublayer, and the second superlattice layer comprises a plurality of pairs of a (2-1)-th sublayer and a (2-2)-th sublayer; and
a second superlattice unit, disposed on the first superlattice unit and comprising a third superlattice layer and a fourth superlattice layer stacked on the third superlattice layer, wherein the third superlattice layer comprises a plurality of pairs of a (3-1)-th sublayer and a (3-2)-th sublayer, and the fourth superlattice layer comprises a plurality of pairs of a (4-1)-th sublayer and a (4-2)-th sublayer,
wherein a composition of the first superlattice layer is the same as a composition of the third superlattice layer, a composition of the second superlattice layer is the same as a composition of the fourth superlattice layer, a thickness of the (2-1)-th sublayer is greater than a thickness of the (1-1)-th sublayer, and a thickness of the (2-2)-th sublayer is smaller than a thickness of the (1-2)-th sublayer.

2. The semiconductor structure of claim 1, further comprising a plurality of repeating units, wherein each of the repeating units comprising the first superlattice unit and the second superlattice unit.

3. The semiconductor structure of claim 1, wherein the thickness of the (1-1)-th sublayer is smaller than the thickness of the (1-2)-th sublayer, and an aluminum atom concentration of the (1-1)-th sublayer is higher than an aluminum atom concentration of the (1-2)-th sublayer.

4. The semiconductor structure of claim 1, wherein an aluminum atom concentration of the (2-1)-th sublayer is higher than an aluminum atom concentration of the (1-1)-th sublayer, and an aluminum atom concentration of the (4-1)-th sublayer is higher than an aluminum atom concentration of the (3-1)-th sublayer.

5. The semiconductor structure of claim 1, wherein an aluminum atom concentration of the (2-2)-th sublayer is higher than an aluminum atom concentration of the (1-2)-th sublayer, and an aluminum atom concentration of the (4-2)-th sublayer is higher than an aluminum atom concentration of the (3-2)-th sublayer.

6. The semiconductor structure of claim 1, wherein an average aluminum atom concentration of the second superlattice layer is higher than an average aluminum atom concentration of the first superlattice layer, an average aluminum atom concentration of the fourth superlattice layer is higher than an average aluminum atom concentration of the third superlattice layer, and the average aluminum atom concentration of the first superlattice layer is equal to the average aluminum atom concentration of the third superlattice layer.

7. The semiconductor structure of claim 1, wherein the first superlattice unit further comprises a fifth superlattice layer stacked on the second superlattice layer, and the fifth superlattice layer comprises a plurality of pairs of a (5-1)-th sublayer and a (5-2)-th sublayer.

8. The semiconductor structure of claim 7, wherein an aluminum atom concentration of the (5-2)-th sublayer is higher than an aluminum atom concentration of the (2-2)-th sublayer.

9. The semiconductor structure of claim 7, wherein an aluminum atom concentration of the (5-1)-th sublayer is higher than an aluminum atom concentration of the (2-1)-th sublayer.

10. The semiconductor structure of claim 7, wherein a thickness of the (5-1)-th sublayer is greater than the thickness of the (2-1)-th sublayer, and a thickness of the (5-2)-th sublayer is smaller than the thickness of the (2-2)-th sublayer.

11. The semiconductor structure of claim 1, wherein the substrate comprises a silicon-containing substrate or a composite structure substrate, the composite structure substrate comprises a core substrate and a composite material layer wrapping around the core substrate, the core substrate comprises ceramic, silicon carbide, aluminum nitride, or sapphire, and the composite material layer comprises an insulating material layer and a semiconductor material layer.

12. The semiconductor structure of claim 1, wherein the thickness of the (1-1)-th sublayer, the thickness of the (2-1)-th sublayer, a thickness of the (3-1)-th sublayer, and a thickness of the (4-1)-th sublayer all are smaller than 10 nm.

13. The semiconductor structure of claim 1, wherein the epitaxial growth layer comprises an electrical isolation layer, a channel layer, a barrier layer and a doped semiconductor cap layer stacked on the superlattice structure in sequence.

14. The semiconductor structure of claim 1, wherein the (1-1)-th sublayer, the (1-2)-th sublayer, the (2-1)-th sublayer, and the (2-2)-th sublayer comprise aluminum gallium nitride layers with different compositions from each other.

* * * * *